United States Patent [19]
Alam et al.

[11] Patent Number: 5,890,429
[45] Date of Patent: Apr. 6, 1999

[54] METHOD OF MAKING AND BONDING A SCREEN PRINTED INK FILM CARRIER TO AN ELECTRONIC DEVICE

[75] Inventors: Shahriar Alam, Chandler; Thomas A. Hunter, Scottsdale; Michael J. Valle, Mesa, all of Ariz.

[73] Assignee: McDonnell Douglas Corporation, St. Louis, Mo.

[21] Appl. No.: 988,215

[22] Filed: Dec. 10, 1997

[51] Int. Cl.⁶ .................. B41M 1/12; B41M 1/26
[52] U.S. Cl. .................. 101/129; 156/240; 156/277; 156/307.1
[58] Field of Search .................. 101/114, 129; 156/235, 240, 277, 307.1, 307.7; 428/195, 200, 201

[56] References Cited

U.S. PATENT DOCUMENTS

| | | | |
|---|---|---|---|
| 4,308,310 | 12/1981 | Arnold et al. | 156/277 |
| 4,919,994 | 4/1990 | Incremona et al. | 156/277 |
| 5,045,141 | 9/1991 | Salensky et al. | 156/240 |
| 5,352,315 | 10/1994 | Carrier et al. | 156/277 |
| 5,403,422 | 4/1995 | Kawai et al. | 156/307.3 |
| 5,494,180 | 2/1996 | Callahan | 427/102 |
| 5,676,785 | 10/1997 | Samonides | 156/277 |
| 5,699,733 | 12/1997 | Chang et al. | 101/129 |

*Primary Examiner*—Stephen R. Funk
*Attorney, Agent, or Firm*—Westerlund & Powell, P.C.; Ramon R. Hoch

[57] ABSTRACT

Screen ink printed film carrier having an ink screen printed electrical altering image provided on thin adhesive film carrier that is flexible and capable of deformation out of the major plane of the carrier to conform to the exterior contour presented by flat or complicated three-dimensional objects, upon which the film carrier can be affixed.

5 Claims, 2 Drawing Sheets

METHOD OF MAKING AND BONDING A SCREEN PRINTED INK FILM CARRIER TO AN ELECTRONIC DEVICE

BACKGROUND OF THE INVENTION

The present invention relates to an article of manufacture used to alter the electrical attributes of a substrate surface upon which it is affixed.

Conventional R-cards (i.e., resistive or conductive ink printed cards) have been fabricated by screen printing an ink having electric altering properties imparted by resistive or conductive ingredients onto a major surface of a carrier, and thereafter the ink printed carrier is bonded to a part using a separate intervening adhesive coating. However, this prior approach has been implemented using a flat, relatively stiff, cured substrate carrier to print upon. For example, one approach has been to print the ink on a cured epoxy-glass laminate and then subsequently use separate film adhesive material to bond such an R-card to a part. Such an approach increased costs and labor, e.g., due to the adhesive coat operation. Also, the use of a rigid backing as a carrier for the screen printed ink has the drawback that many parts needing electrical field modulation have three dimensional exterior contours and are not flat-surfaced to facilitate interfacial contact with an adhesive coated surface of a rigid carrier for the screen printed ink.

Also, in applications where complex electronic circuits are used, the electronic noise generated by such circuits, i.e., the radio frequency/electromagnetic interference, may be of such level as to be hazardous or detrimental to nearby personnel or other electronic circuits. If such electronic noise reaches a high level, a unit may be in violation of federal regulations or the manufacturer's design specifications, requiring the unit to be recalled by the manufacturer.

One solution to the above problem, is to redesign the circuit components per se to reduce RFI and EMI to acceptable levels. However, this is a costly remedy. It has also been proposed that a foil shield be placed around the electronic circuitry and connected to ground as another viable approach to reducing environmental radiation from electronic circuitry. Towards this end, an aluminum or copper foil has been adhesively coated on both sides of a substrate, and an outer wrapping layer of polyester or plastics material has been applied thereto. However, these metal foil shielding arrangements are relatively costly and are not especially durable.

Also in the prior art, it is known to reduce EMI within a microwave module by producing a sheet of absorber material, such as an elastomer material filled with iron powder, cutting out a pattern from the sheet of absorber material to fit around the components within the module (this pattern generally being relatively complex in shape), and then bonding the absorber to the module lid with an adhesive. However, the precision shaping and positioning required of the sheet of absorber material significantly increase costs. In an effort to lower these costs, it also has been previously proposed to directly form a screen printed microwave absorbing material on microwave module lids, such as by dispersion of a microwave absorbing material like powdered iron or ferrite particles in a thermosetting liquid resin, and curing the ink, to suppress EMI. While such direct screen printing approaches may be useful for flat, two-dimensional substrates, it is not particularly practical for implementation on three-dimensional substrates of complex surface geometries.

SUMMARY OF THE INVENTION

The present invention relates to ink screen printing of electrical altering images onto thin adhesive film carriers that are flexible and capable of deformation out of the major plane of the carrier to conform to the exterior contour presented by flat or even complicated three-dimensional objects, upon which the film carrier can be affixed by using the intrinsic or latent (e.g., heat-activatable) tackiness of the carrier film material without the need to resort to extraneous adhesives. Resistive and conductive images can be deposited directly on the thin adhesive carrier film used in this invention in a desired pattern by screen printing so as to be tailored to meet desired electrical properties.

Other advantages associated with this invention include the fact that the ink is cured simultaneous with the bonding of the screen ink patterned carrier film per se to a substrate, to thereby reduce the number of required process steps, and thus the cost of such screen ink printing. The invention also provides a thinner dielectric layer. Also, the ink can become an integral part of the host structure upon which it is affixed. The inventive screen ink printed thin film adhesive carrier can be used as an R-card used on RAM (i.e., a radar absorbing material) or RAS (i.e., a radar absorbing surface) with complicated geometries, such as ground planes for antennas, frequency selective surfaces (FSS), and loaded elastomers. The inventive screen ink printed thin film adhesive carrier also can be used as coupled with RAM or RAS for EMI shielding and attenuation, thermashielding, and anechoic chambers.

BRIEF DESCRIPTION OF THE DRAWINGS

These and various other features and aspects of the present invention will be readily understood with reference to the following detailed description read in conjunction with the accompanying drawings, in which.

DETAILED DESCRIPTION OF THE INVENTION

Figure 1:
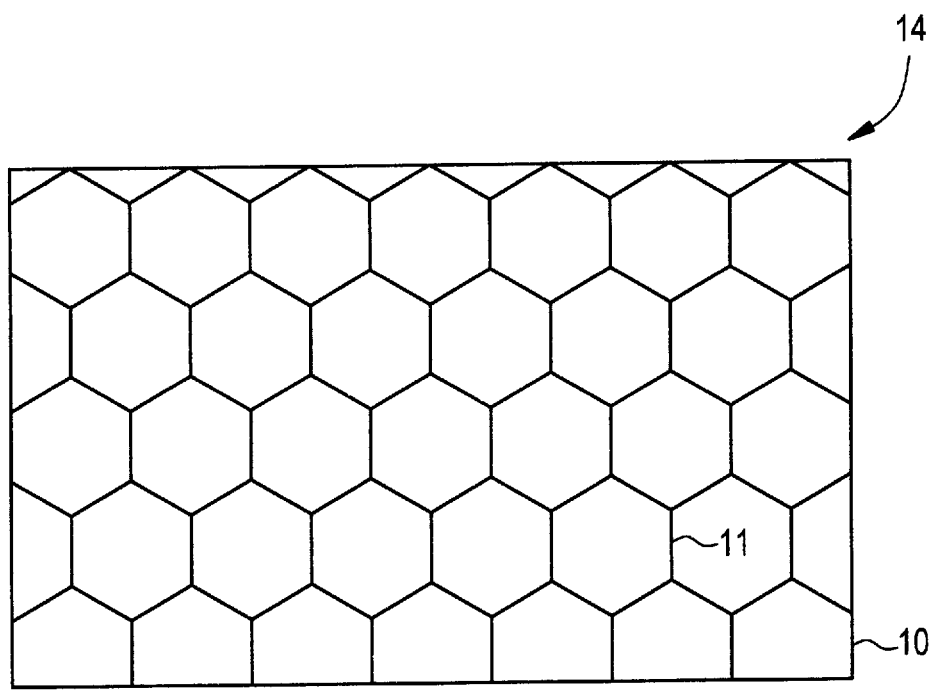
FIG. 1 is a top view of a screen printed thin film adhesive carrier of this invention in which the ink is deposited in a hexagonal pattern.

Referring now to the drawings, and particularly to FIG. 1, there is shown a screen printed thin film adhesive carrier 14 including a thin film adhesive carrier 10 upon which the screen printed ink 11 is deposited in a hexagonal pattern. The ink pattern is not necessarily limited thereto and the invention can be customized for the particular application.

Figure 2:
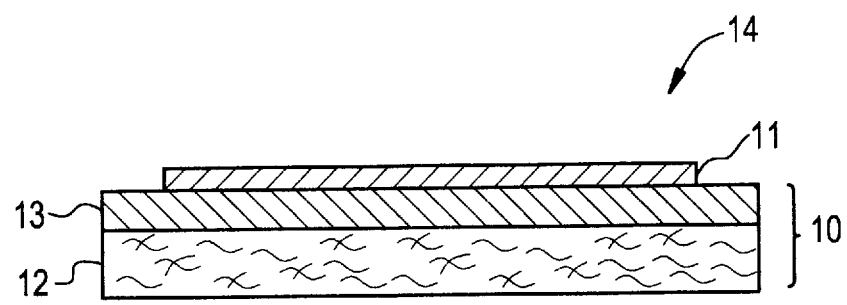
FIG. 2 is a cross-sectional view of the screen printed thin film adhesive carrier of FIG. 1.
Figure 3:
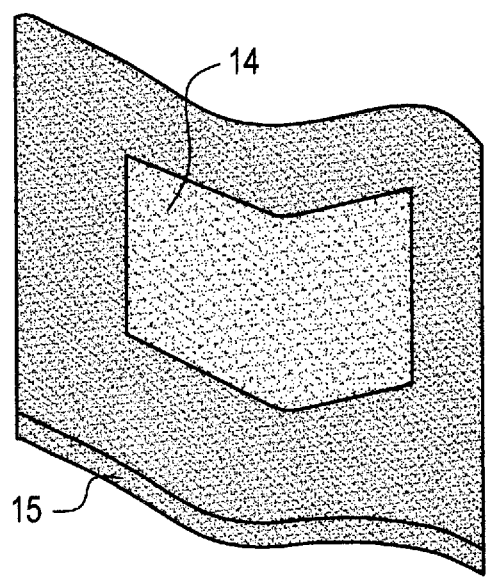
FIG. 3 is a perspective view of a screen printed thin film adhesive carrier of this invention used as an R-card applied to a contoured substrate having a three-dimensional exterior geometry.

FIG. 2 is a cross-sectional view of the screen printed thin film adhesive carrier 14 of FIG. 1. The thin film adhesive carrier 10 is a composite structure including a base fibrous layer 12 bearing a continuous surface film 13 of a thermosetting resin. It is also possible to employ a carrier devoid of a fibrous backing, although the continuous film will need to be thick enough to maintain its structural integrity during curing operations when the printed carrier 14 is united to a substrate. The screen printed thin film adhesive carrier 14 of this invention can be applied to a flat or three-dimensional substrate surface in a facile manner. FIG. 3 illustrates a screen printed thin film adhesive carrier 14 of this invention used as an R-card applied to a contoured part 15, which can be foam or other suitable material, as the substrate having a three-dimensional exterior geometry.

In many applications, a screen inked pattern that is required to be frequency specific must be maintained at 1–2 mm resolution through cure. This specification has been met by the present invention.

Namely, an important attribute of the screen printed film carrier 14 of this invention is that the unit 14 can be attached to a device substrate in an efficient manner where the screen printed pattern 11 and the continuous film 13 are co-cured during bonding of the unit 14 to the substrate.

To accomplish this, the carrier film 10 can comprise a textile layer, such as a woven layer, a knit layer, a scrim layer, or a nonwoven layer, of approximately 5 to 15 mils (about 125 to 380 $\mu$m) covered on one surface with a continuous surface layer 13 formed of a thermosetting resin, such as an epoxy compound, of a thickness of about 1 to 10 mils (about 25 to 250 $\mu$m). The screen printed film carrier 14 can have an overall density of about 0.05 to 0.1 lb/ft$^3$. As a specific example, the composite carrier film backing can be a commercially available product obtained under the trade name FM-300 from Cytech Corporation, in which the composite carrier film 14 has an overall thickness of 13 mils including a fibrous backing 12 that is an 8 mil thick open knit polyester scrim and a continuous surface layer 13 formed thereon of an epoxy resin. Preferably, the epoxy resin used in the continuous surface layer 13 is pre-staged to the B-stage so that it has sufficient structural integrity to tolerate handling without undue flow or thinning when screen printed upon or when bonded to a substrate before full cure to the C-stage is effected.

The relative thicknesses of the fibrous backing 12 and the continuous surface layer 13 are preferably selected to be as thin as possible to save costs and increase the conformability of the unit 14 while ensuring sufficient thickness is provided to maintain structural integrity during handling, screen printing and bonding/curing. It also is preferred that the continuous surface layer 13 be a thermosetting resin of sufficient thickness to provide a continuous robust bonding surface for the screen ink that will not thin, while allowing for some excess to flow into, partially impregnate, and anchor to the interstices of the fibrous layer 13.

The continuous surface layer 13 can be applied to the fibrous backing 12 by any one of a wide variety of conventional techniques such as sheet extrusion, calendering, film casting, or planar coating (e.g., roller or knife techniques).

The ink pattern 11 can then be formed on the continuous surface layer 13 of the carrier film 10 in the following manners.

There are least two basic techniques for applying the screen ink pattern 11 to the continuous surface layer 13 of the carrier film 10. According to a first technique, in a first print, a carbon-loaded curable thermosetting resin is coated in the desired pattern on the continuous surface layer 13. The first print is dried but not resin cured at this point. Then a second print of resistive or conductive material, e.g., resin binder dispersed silver, is screen printed on the previously coated carbon-loaded phenolic resin. For conductive ink resin applications, the second print is primarily composed of a blend of phenolic resin, epoxy resin and powdered, dispersed pure silver as the ingredients, in one preferred embodiment. For magnetic ink applications, the second print can contain powdered iron and ferrites, in preferred embodiments. The curable resin contained in the first print can be a thermosetting resin such as phenolic, epoxy, or polyimide, or any combination thereof. The preferred phenolic resin is a novolac-type phenolic resin including acid-catalyzed condensation products of formaldehyde or para-formaldehyde with a phenolic compound such as phenol, cresol, xylenol and the like. Suitable modified novolac resins include phenol novolac resin, cresol novolac resin, a tert-butyl phenol novolac resin, a nonylphenol novolac resin, and butylated novolac-type phenolic.

The above-mentioned phenolic compounds and the like may be used alone or as a combination of two or more kinds or more according to need. The carbon black is added to the first print in an amount sufficient to adjust the flow and viscosity characteristics of the first print to the desired extent such that the first print does not unduly flow or sag while still being spreadable.

According to a second technique of screen ink printing for this invention, a thermosetting resin, such as an epoxy-hardenable phenolic resin, having silver particles dispersed therein, is printed as a single layer on the continuous surface layer 13 and allowed to dry but it is not resin cured until after the screen printed film carrier 14 has been adhesively bonded to the desired substrate surface.

The overall thickness of the screen printed pattern 11, as dried but not yet cured, generally can be about 0.25 to 1.5 mils, more preferably about 0.5 mils.

The implementation of the printing process can be that of screen printing as widely known generally in the mechanical and printing arts. The screen printing process intimately joins the silver, or other resistive or conductive, layer to the thin film carrier layer without the need of an adhesive, so that separation or peeling of the layers does not occur during use of the product.

During the screen printing process, silver is applied in a commercially available ink form which includes appropriate binders and solvents. Essentially all of the silver ink binders and solvents are evaporated during a subsequent heat curing process step thus leaving a nearly pure precious silver conductive layer which serves in use, for example, to capture electromagnetic radiation and direct it to electrical ground.

The screen printing can be practiced, for example, by using mesh screen, e.g., about 60–70 mesh, filled with a patterned emulsion coating. Sharp pattern edges definition is provided when one or more layers of commercially available direct film photo emulsion are used to fill the screen, the emulsion is image-wise exposed and the desired pattern remains in the screen when the exposed emulsion areas are washed out of the screen with water. To print a pattern on the continuous surface layer 13 of the carrier film 10, a line of ink is poured on the screen and drawn across the patterned area with a squeegee. Each print with about a 60–70 mesh deposits about 0.002 to 0.004 inches (0.05 to 0.10 mm) of ink coating material.

The flow characteristics of the thermosetting resins used in any of the screen prints can be further customized by addition of conventional inorganic fillers and/or thixotropic agents, such as fumed silica (e.g., Cabot Cab-O-Sil products). The shelf life of the inks is about one year from the ink production date at normal room temperature (i.e., about 25° C.).

After screen printing, the screen printed carrier film 14 can be stored or transported to where it can be contacted to a three-dimensional surface of an electronic device. The inked side 11 of the screen ink printed film carrier 14 is arranged as facing the intended substrate surface.

Heat and pressure must be supplied effective to not only bond the screen ink printed film carrier 14 to the three-dimensional surface of an electronic device, but to concurrently permit co-cure of the curable resin of the ink pattern and the curable continuous surface material of the thin film carrier. While the screen printed adhesive film carrier device can be bonded to flat or three dimensional substrates, it is especially well-suited for unification to complex three-dimensional geometries. The three-dimensional substrate can be operative electronic circuitry. The substrate can be a RAM or RAS substrate.

A suitable means of bonding the screen printed film carrier 14 to a substrate involves pressure-assisted techniques such as a vacuum bag technique. The vacuum bag technique involves the use of a flexible plastic bag, such as polyamide or polyester, to wrap the substrate bearing the screen printed film carrier in the desired position thereon. The edges of the bag are sealed. The bagged lay-up is placed either in an autoclave or on external caul plate for curing under high temperature and pressure. A vacuum is drawn in the bag during curing to extract volatile by-products of the curing reaction of the thermosetting resins, viz., phenolic resins. The cure conditions using screen printed adhesive film carrier device materials such as described hereinabove, generally are a temperature of 350° F. (about 180° C.), about 25 p.s.i. of pressure, and cure time of about 60 minutes to about 80 minutes.

The screen printed patterns 11 maintain their high resolution through curing in the inventive screen printed carrier film units. The screen printed patterns 11 also integrate with the adjoining continuous surface film 13 without loss of resolution. Additionally, the need for an extraneous adhesive between the screen ink pattern and the intended substrate is obviated in the present invention. The inventive screen printed carrier film is very flexible, yet robust, such that it can be conformed and bonded to many complex three-dimensional substrate geometries without difficulty. Also, only a relatively thin dielectric layer is required in the screen printed carrier film so as to reduce material costs and to provide advantageous electrical characteristics for electromagnetic applications.

Although presently preferred embodiments of the present invention have been described in detail hereinabove, it should be clearly understood that many variations and/or modifications of the basic inventive concepts herein taught, which may appear to those skilled in the pertinent art, will still fall within the spirit and scope of the present invention, as defined in the appended claims.

What is claimed is:

1. A method of bonding a screen ink printed film carrier to a three-dimensional surface of an electronic device, comprising:

providing a thin film carrier comprising a curable adhesive material;

screen printing on said curable adhesive material of said thin film carrier an ink pattern containing an electrically resistive or conductive material and a curable resin to provide a screen ink printed film carrier;

contacting said screen ink printed film carrier to the three-dimensional surface of the electronic device; and applying heat and pressure effective to co-cure said curable resin of said ink pattern and said curable adhesive material of said thin film carrier and bond said screen ink printed film carrier to the three-dimensional surface of the electronic device.

2. The method of claim 1, wherein said screen printing step comprises a first substep of screen printing a carbon-loaded phenolic resin on said thin film carrier followed by a second substep of screen printing silver on said previously coated carbon-loaded phenolic resin.

3. The method of claim 2, wherein said curable resin used in said screen printing step comprises a screen printing thermosetting resin having silver particles dispersed therein on said thin film carrier, wherein said thermosetting resin comprises an epoxy-hardenable phenolic.

4. The method of claim 1, wherein said electrically resistive or conductive material is selected from the group consisting of silver, nickel, copper, platinum, and palladium.

5. The method of claim 1, wherein said film carrier comprises a fibrous sublayer and said curable adhesive material is a continuous surface layer comprising a thermosetting resin attached to said fibrous sublayer.

* * * * *